(12) United States Patent
Nakamura et al.

(10) Patent No.: US 10,804,920 B2
(45) Date of Patent: Oct. 13, 2020

(54) A/D CONVERTER

(71) Applicant: DENSO CORPORATION, Kariya, Aichi-pref. (JP)

(72) Inventors: Kunihiko Nakamura, Kariya (JP); Yu Fujimoto, Kariya (JP); Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/596,927

(22) Filed: Oct. 9, 2019

(65) Prior Publication Data

US 2020/0162093 A1 May 21, 2020

(30) Foreign Application Priority Data

Nov. 20, 2018 (JP) .................................. 2018-217264

(51) Int. Cl.
| | |
|---|---|
| *H03M 1/12* | (2006.01) |
| *H03M 1/14* | (2006.01) |
| *H03M 1/80* | (2006.01) |
| *H03M 1/68* | (2006.01) |
| *H03M 1/46* | (2006.01) |

(52) U.S. Cl.
CPC ......... *H03M 1/1245* (2013.01); *H03M 1/145* (2013.01); *H03M 1/466* (2013.01); *H03M 1/68* (2013.01); *H03M 1/802* (2013.01)

(58) Field of Classification Search
CPC .... H03M 1/1245; H03M 1/145; H03M 1/466; H03M 1/68; H03M 1/802
USPC ................................................ 341/140–170
See application file for complete search history.

(56) References Cited

U.S. PATENT DOCUMENTS

| | | | | |
|---|---|---|---|---|
| 6,869,216 | B1 * | 3/2005 | Holloway | G01K 1/028 |
| | | | | 341/143 |
| 6,999,014 | B2 | 2/2006 | Oliaei et al. | |
| 9,071,259 | B2 * | 6/2015 | Nezuka | H03M 1/001 |
| 10,158,369 | B2 * | 12/2018 | Nezuka | H03M 1/145 |

(Continued)

*Primary Examiner* — Lam T Mai
(74) *Attorney, Agent, or Firm* — Posz Law Group, PLC

(57) ABSTRACT

An input signal Vin is sampled, when a first terminal of a sampling capacitor is connected to a node and a second terminal of the sampling capacitor is connected to an analog ground. A charge transfer operation is performed, when the first terminal of the sampling capacitor is connected to the analog ground and the second terminal of the sampling capacitor is connected to an inverting input terminal of an operational amplifier. A quantization is performed, when an output of the operational amplifier is input to a quantizer. Most significant bits are generated by repeating a subtraction operation in which a charge subtraction unit subtracts a charge accumulated in the integration capacitor based on a quantization result a predetermined number of times. Least significant bits are generated when a voltage provided by amplifying a voltage corresponding to a charge remaining in the integration capacitor is input to a sub-A/D converter after generation of the most significant bits. A sum of the most significant bits and the least significant bits are output as an output signal. Initialization of the charge of the integration capacitor, the charge transfer operation for a next A/D conversion, and generation of the most significant bits are performed in parallel with the A/D conversion in the sub-A/D converter after the generation of the most significant bits.

8 Claims, 12 Drawing Sheets

(56) References Cited

U.S. PATENT DOCUMENTS

| | | | |
|---|---|---|---|
| 2002/0149508 A1* | 10/2002 | Hamashita | H03M 3/496 341/172 |
| 2013/0057421 A1* | 3/2013 | Aruga | H03M 3/02 341/143 |
| 2015/0145535 A1* | 5/2015 | Nys | G06F 3/044 324/679 |
| 2016/0043733 A1* | 2/2016 | Nezuka | H03M 3/368 341/143 |
| 2018/0212616 A1 | 7/2018 | Nezuka | |
| 2019/0215004 A1* | 7/2019 | Nezuka | H03F 3/45 |
| 2020/0153446 A1* | 5/2020 | Nakamura | H03M 1/0678 |

* cited by examiner

A/D CONVERTER

CROSS REFERENCE TO RELATED APPLICATION

The present application claims the benefit of priority from Japanese Patent Application No. 2018-217264 filed on Nov. 20, 2018. The entire disclosures of the above application are incorporated herein by reference.

TECHNICAL FIELD

The present disclosure relates to an A/D converter for converting an analog signal, which is an input signal, into a digital value.

BACKGROUND ART

Conventionally, various A/D converters are proposed. In one example disclosure, an A/D converter is configured to generate an A/D conversion result by sampling an input signal by using an integration capacitor and sequentially subtracting charges from the integration capacitor according to an output of a comparator. In another example disclosure, an incremental A-type A/D converter is configured to vary an amount of feedback by an analog quantizer.

SUMMARY OF THE DISCLOSURE

The present disclosure provides an A/D converter for converting an analog signal as an input signal into a digital value. The A/D converter comprises a sampling capacitor, an integrator, a quantizer, a charge subtraction unit and a sub-A/D converter. The integrator includes an operational amplifier and an integration capacitor provide between a first input terminal and an output terminal of the operational amplifier. The quantizer outputs a quantization result provided by quantizing an output signal of the operational amplifier. The charge subtraction unit includes a D/A converter that determines a DAC voltage for subtracting a charge of the integration capacitor based on the quantization result, and a DAC capacitor which stores a charge corresponding to the DAC voltage. The sub-A/D converter is connected to the output terminal of the operational amplifier in parallel with the quantizer, and has a sample-and-hold structure at its input stage.

DETAILED DESCRIPTION OF THE EMBODIMENT

Figure 1:
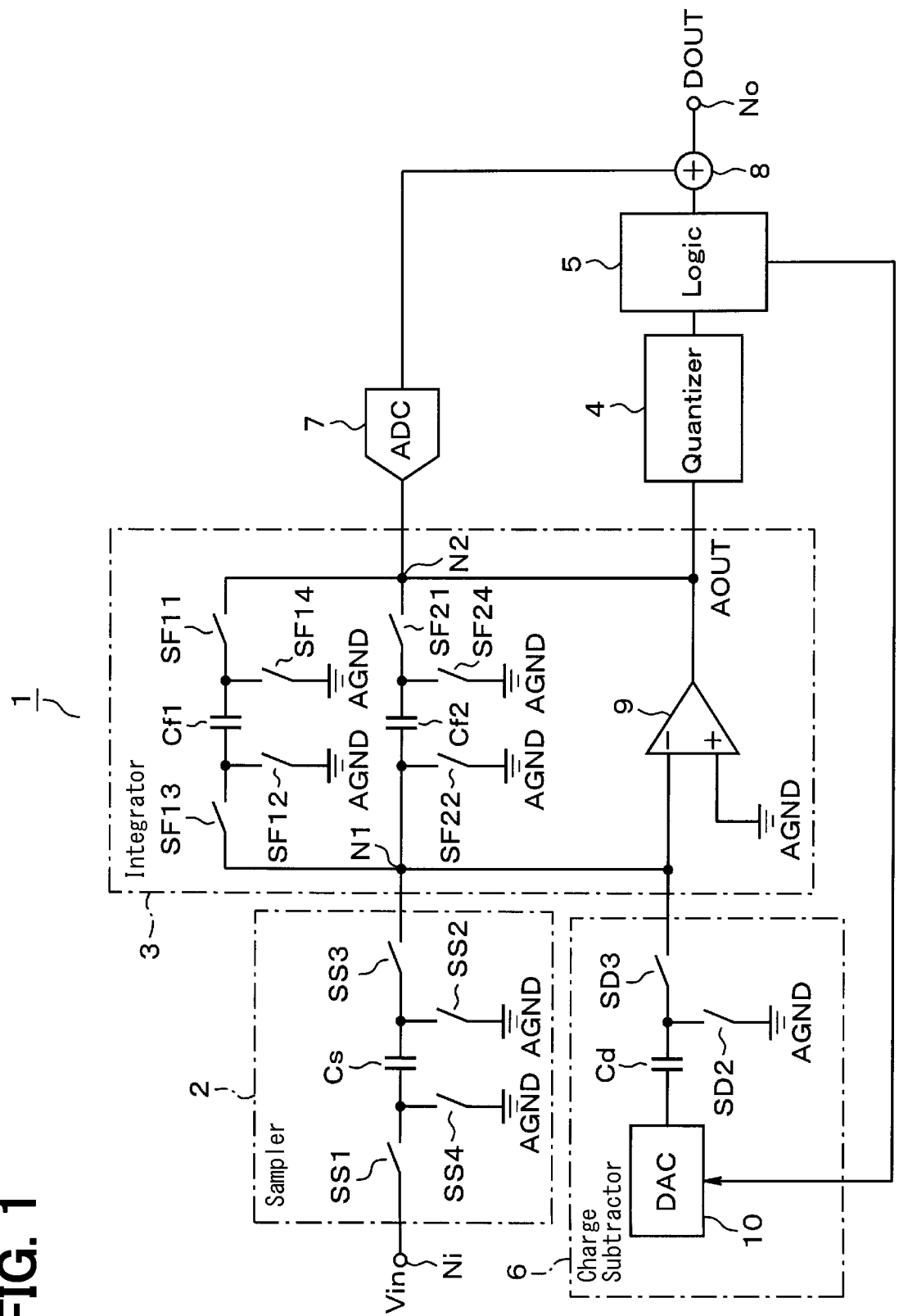
FIG. 1 is a circuit diagram schematically showing a configuration of an A/D converter according to a first embodiment.

Hereinafter, multiple embodiments will be described with reference to the drawings. In the respective embodiments described below, substantially same configurations are denoted by same symbols and reference numerals thereby simplifying repetitive description.

First Embodiment

A first embodiment will be described with reference to FIG. 1 and FIG. 2.

An A/D converter 1 shown in FIG. 1 is configured to convert an input signal Vin that is an analog voltage into an output signal DOUT that is a digital value. The A/D converter 1 includes a sampler 2, an integrator 3, a quantizer 4, a logic circuit 5, a charge subtraction unit 6, a sub-A/D converter 7, an adder 8 and the like. Hereinafter, the A/D converter is abbreviated as ADC.

The sampler 2 includes a sampling capacitor Cs for sampling the input signal Vin, switches SS1, SS2, SS3, SS4, and the like. On/off states of the switches SS1 to SS4 are controlled by a switch control circuit (not shown). It is noted that each on/off state of switches described later is also controlled by the switch control circuit. A first terminal of the sampling capacitor Cs is connected to an input node Ni, to which the input signal Vin is applied, through the switch SS1, and is connected to an analog ground in the ADC 1 through the switch SS4. The analog ground is simply indicated and referred to as AGND.

The AGND is a reference potential in the ADC 1 and is not necessarily 0V. A second terminal of the sampling capacitor Cs is connected to the AGND through the switch SS2, and is connected to a node N1 of the integrator 3 through the switch SS3.

In the sampler 2 configured as described above, when the switches SS1 and SS2 are turned on and the switches SS3 and SS4 are turned off, the first terminal of the sampling capacitor Cs is connected to the input node Ni and the second terminal of the sampling capacitor Cs is connected to the AGND. As a result, the sampler 2 performs a sampling operation for sampling the input signal Vin.

Further, when the switches SS1 and SS2 are turned off and the switches SS3 and SS4 are turned on, the first terminal of the sampling capacitor Cs is connected to the AGND and the second terminal of the sampling capacitor Cs is connected to the node N1 of the integrator 3. As a result, in the sampler 2, a charge transfer operation is performed in which the charge of the sampling capacitor Cs is transferred from the sampling capacitor Cs to integrator 3.

The integrator 3 includes an operational amplifier (hereinafter referred to as OP amplifier) 9, integration capacitors Cf1 and Cf2, switches SF11, SF12, SF13, SF14, SF21, SF22 and SF24. An inverting input terminal corresponding to a first input terminal of the OP amplifier 9 is connected to the node N1. That is, the second terminal of the sampling capacitor Cs is connected to the inverting input terminal of the OP amplifier 9 through the switch SS3. A non-inverting input terminal of the OP amplifier 9 is connected to the AGND.

A first terminal of the integration capacitor Cf1 is connected to the node N1 through the switch SF13 and is connected to the AGND through the switch SF12. A second terminal of the integration capacitor Cf1 is connected to a node N2 through the switch SF11 and is connected to the AGND through the switch SF14. The node N2 is connected to an output terminal of the OP amplifier 9.

A first terminal of the integration capacitor Cf2 is connected to the node N1 and is connected to the AGND through the switch SF22. A second terminal of the integration capacitor Cf2 is connected to the node N2 through the switch SF21 and is connected to the AGND through the switch SF24. As described above, the integration capacitors Cf1 and Cf2 are connected in parallel to each other and both provided between the inverting input terminal and the output terminal of the OP amplifier 9.

The quantizer 4 receives an output of the integrator 3, that is, an output signal AOUT of the OP amplifier 9. The quantizer 4 quantizes the output signal AOUT that is an analog value, and outputs a quantization result that is a result of the quantization. An output of the quantizer 4 is input to the logic circuit 5. The logic circuit 5 outputs the quantization result of the quantizer 4 to the charge subtraction unit 6. Further, the logic circuit 5 generates and outputs a digital value corresponding to most significant bits of an output signal DOUT, which are upper digit bits in the output signal DOUT, based on the quantization result of the quantizer 4.

The charge subtraction unit 6 includes a D/A converter 10, a DAC capacitor Cd, switches SD2 and SD3, and the like. Hereinafter, the D/A converter 10 is abbreviated as DAC 10. The DAC 10 determines an amount of charge to be subtracted from the integration capacitors Cf1 and Cf2 based on the quantization result provided from the logic circuit 5. That is, the DAC 10 determines a DAC voltage for subtracting the charges accumulated in the integration capacitors Cf1 and Cf2. The DAC 10 is a tri-level DAC having Vm set to, for example, the AGND, a Vrefp set to a potential higher than the AGND, and a Vrefm set to a potential lower than the AGND as a reference voltage. Vrefp and Vrefm are set so that the absolute values are the same and the signs are opposite, in case that the AGND is 0 V.

A first terminal of the DAC capacitor Cd is connected to an output terminal of the DAC 10. A second terminal of the DAC capacitor Cd is connected to the AGND through the switch SD2, and is connected to the node N1 of the integrator 3 through the switch SD3. In such a configuration, when the switch SD3 is turned off and the switch SD2 is turned on, a sampling operation is performed in which a charge corresponding to a DAC voltage is accumulated in the DAC capacitor Cd. That is, the DAC capacitor Cd accumulates the charge according to the DAC voltage output from the DAC 10.

In a state where the charge is accumulated in the DAC capacitor Cd, the DAC 10 outputs a DAC voltage corresponding to the quantization result of the quantizer 4, when the switch SD2 is turned off and the switch SD3 is turned on. At this time, a charge transfer operation is performed in which a charge corresponding to a potential difference between the DAC voltage in a sample period and the DAC voltage in a hold period is transferred to the integration capacitors Cf1 and Cf2 of the integrator 3. That is, the charge subtraction unit 6 performs such a charge transfer operation, thereby subtracting the charge based on the quantization result from the charges accumulated in the integration capacitors Cf1 and Cf2. The sample period means a period in which the sampling operation in the charge subtraction unit 6 is performed. The hold period means a period in which the holding operation in the charge subtraction unit 6 is performed.

The input terminal of the sub-ADC 7 is connected to the node N2 of the integrator 3. That is, the sub-ADC 7 is connected to the output terminal of the OP amplifier 9 of the integrator 3 in parallel with the quantizer 4. The sub-ADC 7 generates and outputs a digital value corresponding to the least significant bits of the output signal DOUT, which are lower digit bits in the output signal DOUT. The digital value output from the sub-ADC 7 is input to the adder 8 together with the digital value output from the logic circuit 5. The adder 8 generates the output signal DOUT generated by adding the digital values. The output signal DOUT is output through a node No. As the sub-ADC 7, a general ADC having a sample-and-hold structure in its input stage may be adopted.

As described above, the ADC 1 of the present embodiment is provided by changing the sampling configuration of the conventional ADC. Therefore, since operations other than the operation related to sampling are similar to the conventional ADC, detailed description thereof is omitted because it is conventional.

An operation of the first embodiment configured as above will be described with reference to a timing chart of FIG. 2. The operation described here is merely an example, and various specific numerical values such as the number of cycles in each phase, the number of most significant bits and the number of least significant bits may be arbitrarily set. In FIG. 2, the configuration including the integrator 3 for generating the most significant bits of the output signal DOUT is referred to as a main ADC.

Figure 2:
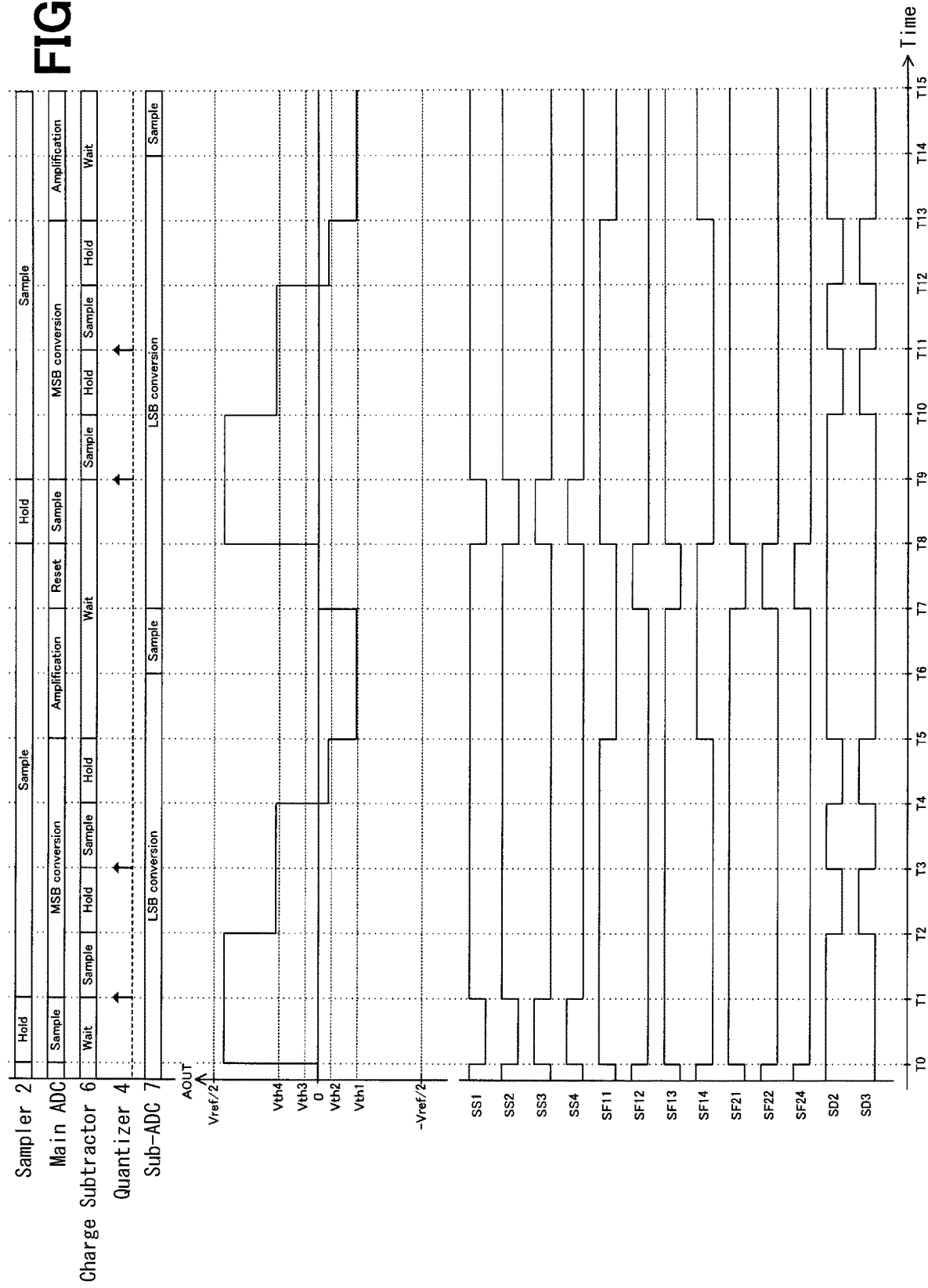
FIG. 2 is a timing chart schematically showing an operation state of each circuit unit in the first embodiment.

In the timing chart of FIG. 2 and the like, the signal at the part to which the symbol of each switch is attached indicates the on/off state of the corresponding switch. Specifically, a period in which a signal is at a high level represents an ON period of the corresponding switch, and a period in which the signal is at a low level represents an OFF period of the corresponding switch.

In this case, the sampling capacitor Cs, the integration capacitor Cf1, Cf2, and the DAC capacitor Cd have capacitance values that satisfy the relationship represented as the following equations (1) and (2). In the following equations, Cs, Cf1, Cf2 and Cd indicate capacitance values of the capacitors Cs, Cf1, Cf2 and Cd, respectively.

$$Cf1 = 2 \times Cd \tag{1}$$

$$Cf2 = 6 \times Cs \tag{2}$$

In this case, the quantizer 4 includes four comparators, which input the output signal AOUT of the OP amplifier 9 and four threshold voltages Vth1, Vth2, Vth3 and Vth4. The above threshold voltages Vth1 to Vth4 are generated based on the reference voltage Vref. The reference voltage Vref and the threshold voltages Vth1 to Vth4 are expressed by the following equations (3) to (7), respectively.

$$Vref = Vref_p - Vref_m \quad (3)$$

$$Vth1 = (-3/16) \times Vref \quad (4)$$

$$Vth2 = (-1/16) \times Vref \quad (5)$$

$$Vth3 = (1/16) \times Vref \quad (6)$$

$$Vth4 = (3/16) \times Vref \quad (7)$$

Therefore, in this case, a subtraction width of the charges of the integration capacitors Cf1 and Cf2 by the DAC 10, that is, the change amount of the output signal AOUT of the OP amplifier 9, is set to five kinds of values, which are (+¼)×Vref, (−¼)×Vref, (+⅛)×Vref, (−⅛)×Vref and 0.

Since the switches SS1 and SS2 are turned off and the switches SS3 and SS4 are turned on during a period of time T0 to time T1, the sampler 2 performs the charge transfer operation. In FIG. 2 and other figures, the charge transfer operation is represented as Hold. Further, the switch SD3 is turned off and the switch SD2 is turned on during the period of time T0 to time T1. At this time, the output terminal of the DAC 10 is connected to Vm internally. Accordingly, during the period from time T0 to time T1, the charge subtraction unit 6 is in a reset state in which the DAC capacitor Cd is reset. In FIG. 2 and other figures, this reset state is indicated as "Wait."

Further, the switches SF12, SF14, SF22 and SF24 are turned off and the switches SF11, SF13, and SF21 are turned on during the period of time T0 to time T1. Thereby, in the integrator 3, the integration capacitors Cf1 and Cf2 are connected in parallel between the inverting input terminal and the output terminal of the OP amplifier 9. Accordingly, during the period from time T0 to time T1, the operation of the main ADC is a sampling operation in which the charge transferred from the sampling capacitor Cs is accumulated in the integration capacitors Cf1 and Cf2. In FIG. 2 and other figures, the sampling operation is indicated as "Sample." Then, the quantization by the quantizer 4 is executed at time T1. In FIG. 2 and other figures, the timing at which the quantization is executed is indicated by an upward arrow.

Further, during a period from time T0 to time T6, the sub-ADC 7 performs an A/D conversion operation for generating a digital value corresponding to the least significant bits of the output signal DOUT. The A/D conversion operation by the sub-ADC 7 includes a series of operations such as resetting. In FIG. 2 and other figures, the A/D conversion operation by the sub-ADC 7 is indicated as "LSB conversion." Since the switches SS3 and SS4 are turned off and the switches SS1 and SS2 are turned on during the period from time T1 to time T8, the sampler 2 performs the sampling operation.

Further, during the period from time T1 to time T5, the main ADC performs the A/D conversion operation for generating the digital value corresponding to the most significant bits of the output signal DOUT. In FIG. 2 and other figures, the A/D conversion operation by the main ADC is indicated as "MSB conversion". Specifically, during the period from time T1 to time T5, the switches SF12, SF13, SF14, SF21, SF22 and SF24 are in the same state as during the period from time T0 to time T1, so that the integration capacitors Cf1 and Cf2 are connected in parallel between the inverting input terminal and the output terminal of the OP amplifier 9.

During the period from time T1 to time T2, the switches SD2 and SD3 are in the same state as during the period from time T0 to time T1, but the DAC 10 outputs the DAC voltage determined based on the quantization result of the quantizer 4 output at time T1. Therefore, during the period from time T1 to time T2, the charge subtraction unit 6 performs the sampling operation for accumulating the charge corresponding to the DAC voltage in the DAC capacitor Cd.

Subsequently, during a period from time T2 to time T3, the switch SD2 is turned off and the switch SD3 is turned on, and the DAC 10 outputs the DAC voltage determined based on the quantization result of the quantizer 4 output at time T1. Therefore, the charge transfer operation by the charge subtraction unit 6 is performed, and thereby, the subtraction operation for subtracting the charges accumulated in the integration capacitors Cf1 and Cf2 is performed. Accordingly, at time T2, the output signal AOUT changes according to the subtraction width in the subtraction operation described above. Then, the quantization by the quantizer 4 is executed at time T3.

During the period from time T3 to time T4, the switches SD2 and SD3 are in the same state as during the period from time T1 to time T2, and the DAC 10 outputs the DAC voltage determined based on the quantization result of the quantizer 4 output at time T3. Therefore, during the period from time T3 to time T4, the charge subtraction unit 6 performs the sampling operation as during the period from time T1 to time T2. Subsequently, during a period from time T4 to time T5, the switches SD2 and SD3 are in the same state as during the period from time T2 to time T3. The DAC 10 outputs the DAC voltage determined based on the quantization result of the quantizer 4 output at time T3, and the charge transfer operation and hence the subtraction operation is performed by the charge subtraction unit 6. Accordingly, at time T4, the output signal AOUT changes according to the subtraction width in the subtraction operation described above.

In this way, the charge subtraction unit 6 repeats the subtraction operation for subtracting the charge accumulated in the integration capacitors Cf1 and Cf2 based on the quantization result of the quantizer 4 a predetermined number of times. The subtraction unit 6 thus generates the digital value corresponding to the most significant bits of the output signal DOUT. In this case, the subtraction operation is performed twice, thereby generating a digital value corresponding to 3 bits.

During a period from time T5 to time T7, the main ADC performs an amplification operation for amplifying the charges remaining in the integration capacitors Cf1 and Cf2. In FIG. 2 and other figures, the amplification operation is indicated as "Amplification." Further, the switches SF11, SF12, SF22 and SF24 are turned off and the switches SF13, SF14 and SF21 are turned on during the period from time T5 to time T7.

As a result, the integration capacitors Cf1 and Cf2 are connected in series between the node N2 and AGND. As a result, all the charge remaining in the integration capacitor Cf1 after generation of the most significant bits is transferred to the integration capacitor Cf2 and input to the sub-ADC 7. Accordingly, at time T5, the output signal AOUT changes according to a capacitance ratio of the integration capacitors Cf1 and Cf2 in the amplification operation described above. Then, during a period from time T6 to time T7, the sub-ADC 7 performs a sampling operation for sampling the input charge. Further, during a period from time T7 to time T14, the sub-ADC 7 performs the A/D conversion operation for generating a digital value corresponding to the least significant bits of the output signal DOUT.

During a period from time T7 to time T8, the main ADC performs a resetting operation for initializing the charges of the integration capacitors Cf1 and Cf2. In FIG. 2 and other figures, the reset operation is indicated as "Reset." Specifically, the switches SF11, SF13 and SF21 are turned off and the switches SF12, SF14, SF22 and SF24 are turned on during the period from time T7 to time T8. As a result, both terminals of the integration capacitors Cf1 and Cf2 are connected to the AGND, and the charges of the integration capacitors Cf1 and Cf2 are initialized.

Further, during the period from time T5 to time T8, the switch SD3 is turned off and the switch SD2 is turned on so that the output terminal of the DAC 10 is connected to Vm internally. Accordingly, during the period from time T5 to time T8, the charge subtraction unit 6 is in a reset state in which the DAC capacitor Cd is reset. After time T8, operations similar to that of the period from time T0 to time T8 described above are repeated.

As described above, the following operation is performed in the ADC 1 according to the present embodiment. That is, the input voltage Vin is sampled by connecting the first terminal of the sampling capacitor Cs to the input node Ni and connecting the second terminal of the sampling capacitor Cs to the AGND. In addition, the charge is transferred from the sampling capacitor Cs to the integration capacitors Cf1 and Cf2 by connecting the first terminal of the sampling capacitor Cs to the AGND and connecting the second terminal of the sampling capacitor Cs to the inverting input terminal of the OP amplifier 9. Quantization is performed by inputting the output of the OP amplifier 9 to the quantizer 4.

Further, the digital value corresponding to the most significant bits of the output signal DOUT is generated by the charge subtraction unit 6, which repeats the subtraction operation of subtracting the charge accumulated in the integration capacitors Cf1 and Cf2 based on the quantization result the predetermined number of times. Further, the digital value corresponding to the least significant bits of the output signal is generated by transferring all the charge remaining in the integration capacitor Cf1 to the integration capacitor Cf2 after the generation of the most significant bits, amplifying the output signal AOUT in accordance with a capacitance ratio and inputting the charge accumulated in the integration capacitor Cf2 to the sub-ADC 7. The sum of these digital values is output as the output signal DOUT from the output node No. Further, in the above configuration, after the generation of the most significant bits, the initialization of the charges of the integration capacitors Cf1 and Cf2, the charge transfer operation related to the next A/D conversion and the generation of the most significant bits are performed in parallel with the A/D conversion in the sub-A/D converter 7.

In the ADC 1 of the present embodiment, the sampling capacitor Cs is provided independently and not shared with the integration capacitor. Therefore, according to the above configuration, the input signal Vin can be amplified and attenuated by the ratio of the capacitance of the sampling capacitor Cs and the parallel combined capacitance of the integration capacitors Cf1 and Cf2, and the input range can be widened. That is, according to the above configuration, the voltage applied between the terminals of the OP amplifier 9 can be set to an arbitrary voltage value in accordance with the capacitance ratio described above, regardless of the level of the input signal Vin. Therefore, according to the above configuration, a signal having a relatively high voltage value can be input as the input signal Vin. In the above configuration, an operation speed is improved by performing the operation described above, that is, a pipeline operation. Therefore, according to the above configuration, it is possible to provide an excellent effect that both speeding up the processing and expansion of the input range can be realized.

In the above configuration, as described above, the sampling capacitor Cs is not shared with the integration capacitor and is provided independently. Therefore, the sampling operation by the sampler 2 can be performed during the A/D conversion operation of the main ADC. Therefore, according to the above configuration, it is possible to lengthen the sampling period for performing the sampling operation as compared with a configuration in which the sampling capacitor is shared with the integration capacitor. Therefore, according to the above configuration, the sampling operation, that is, the charging of the sampling capacitor Cs by the input signal Vin is reliably completed during the desired sampling period even when the current supply capability of the circuit or the sensor that outputs the input signal Vin is low. That is, according to the above configuration, the requirement for output impedance of the circuit or the sensor that outputs the input signal Vin is relaxed.

Second Embodiment

A second embodiment will be described below with reference to FIG. 3.

Figure 3:
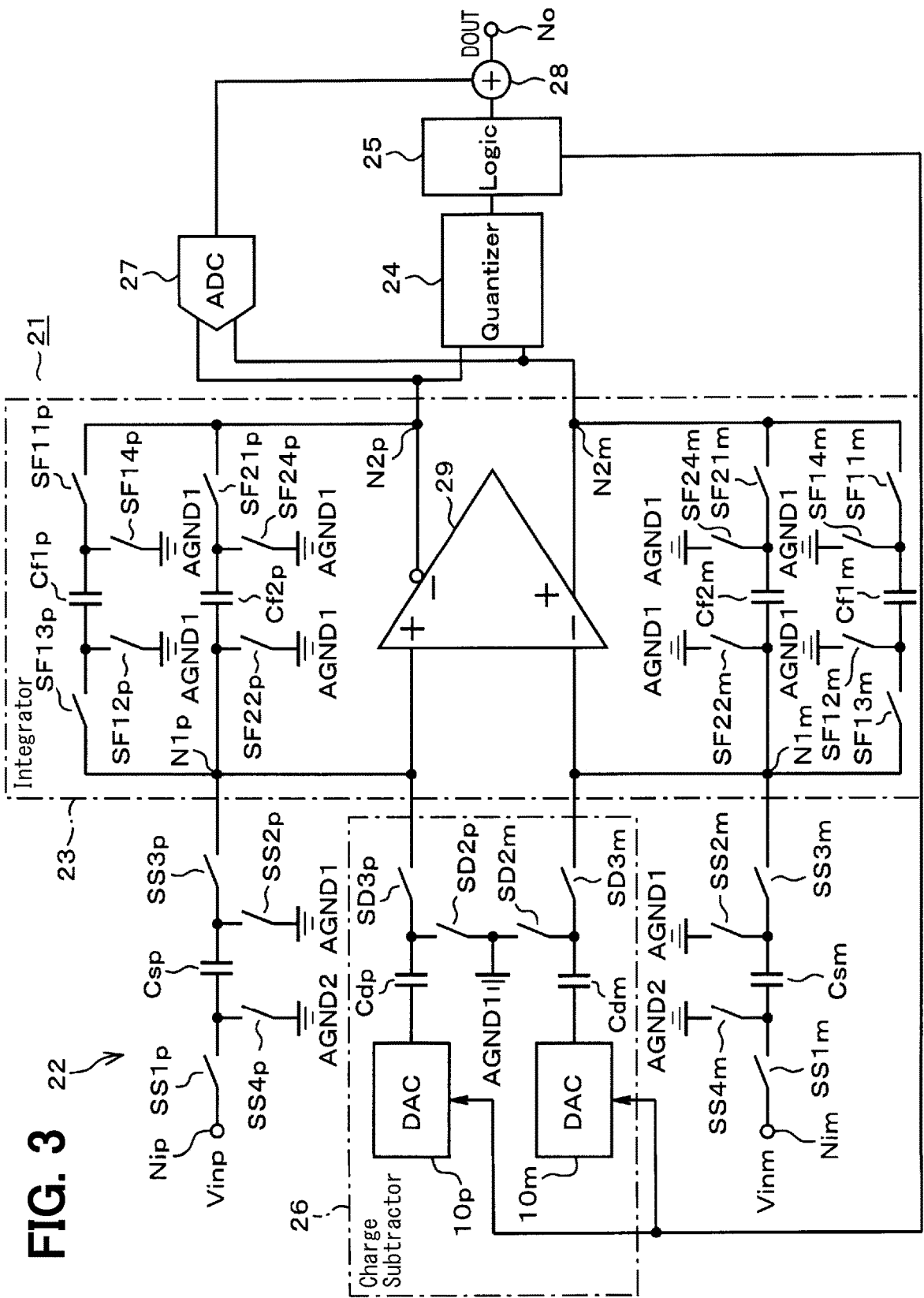
FIG. 3 is a circuit diagram schematically showing a configuration of an A/D converter according to a second embodiment.

As shown in FIG. 3, an ADC 21 of the present embodiment has a differential configuration of the ADC 1 of the first embodiment. That is, the ADC 21 has a differential input configuration that converts a difference between input signals Vinp and Vinm, which are two analog signals that are complementary to each other, into an output signal DOUT that is a digital value.

The ADC 21 includes a sampler 22, an integrator 23, a quantizer 24, a logic circuit 25, a charge subtraction unit 26, a sub-ADC 27, an adder 28 and the like. The sampler 22 has a differential configuration relative to the sampler 2 and includes two sets of configurations similar to the configurations included in the sampler 2. Among the configurations included in the sampler 22, the configuration corresponding to an input signal Vinp is indicated with "p" at the end of the symbol, and the configuration corresponding to an input signal Vinm is indicated with "m" at the end of the symbol.

The integrator 23 has a differential configuration, which is different from the integrator 3, and includes an OP amplifier 29 with a fully differential configuration in place of the OP amplifier 9. The integrator 23 further has two sets of the same configurations as the configuration of the integrator 3 other than the OP amplifier 9. Among the configurations included in the integrator 23, the configuration corresponding to the input signal Vinp is indicated with "p" at the end of the symbol, and the configuration corresponding to the input signal Vinm is indicated with "m" at the end of the symbol. The OP amplifier 29 has a common mode feedback function for adjusting the output common voltage to be an arbitrary constant value. In the following description, the common mode feedback is abbreviated as CMFB.

The quantizer 24 receives an output of the integrator 23, that is, a differential signal output from the OP amplifier 29. The quantizer 24 quantizes a difference between these differential signals and outputs a quantized result. An output of the quantizer 24 is input to the logic circuit 25. The logic circuit 25 outputs the quantization result of the quantizer 24 to the charge subtraction unit 26. Further, the logic circuit 25 generates and outputs a digital value corresponding to most significant bits of the output signal DOUT based on the quantization result of the quantizer 24.

The charge subtraction unit 26 has a differential configuration relative to the charge subtraction unit 6, and includes two sets of configurations each of which is similar to that of the charge subtraction unit 6. Among the configurations included in the charge subtraction unit 26, the configuration corresponding to the input signal Vinp is indicated with "p" at the end of the symbol, and the configuration corresponding to the input signal Vinm is indicated with "m" at the end of the symbol.

Input terminals of the sub-ADC 27 are connected to nodes N2p and N2m of the integrator 23. That is, the sub-ADC 27 is connected to output terminals of the OP amplifier 29 of the integrator 23 in parallel with the quantizer 24. The sub-ADC 27 generates and outputs a digital value corresponding to the least significant bits of the output signal DOUT. The digital value output from the sub-ADC 27 is input to the adder 28 together with the digital value output from the logic circuit 25. The adder 28 generates the output signal DOUT generated by adding the digital values.

In FIG. 3 and the following description, the analog ground that is the reference potential in the ADC 21 is referred to as AGND1. In this case, first terminals of the sampling capacitors Csp and Csm are connected to a common voltage of the two input signals Vinp and Vinm instead of AGND1 via switches SS4p and SS4m, respectively. In FIG. 3 and the following description, the above common voltage is referred to as AGND2.

In the sampler 22 configured as described above, when the switches SS1p and SS2p are turned on and the switches SS3p and SS4p are turned off, the first terminal of the sampling capacitor Csp is connected to the input node Nip and the second terminal of the sampling capacitor Csp is connected to the AGND1. As a result, the sampler 22 performs a sampling operation for sampling the input signal Vinp. It is noted that a sampling operation for the input signal Vinm is similar to the sampling operation for the input signal Vinp, and a description thereof will be omitted.

Further, when the switches SS1p and SS2p are turned off and the switches SS3p and SS4p are turned on, the first terminal of the sampling capacitor Csp is connected to the AGND2 and the second terminal of the sampling capacitor Csp is connected to a node N1p of the integrator 23. As a result, in the sampler 22, a charge transfer operation is performed in which the charge is transferred from the sampling capacitor Csp to the integration capacitors Cf1p and Cf2p of the integrator 23.

It is noted that a charge transfer operation for the input signal Vinm is similar to the charge transfer operation for the input signal Vinp, and a description thereof will be omitted. Thus, in the above configuration, when charge is transferred from the sampling capacitor to the integration capacitor, the first terminal of the sampling capacitor is connected to the AGND2 which is the common voltage of the two input signals Vinp and Vinm in place of connection to the AGND1.

According to the above configuration, the input common voltage of the OP amplifier 29 does not vary for the following reason. First, the following equations (21), (22) and (23) are derived from the law of charge conservation and the function of CMFB. In the following equations, Cs indicates a capacitance of the sampling capacitors Csp and Csm, Vinp and Vinm indicate voltages at the first terminals of the sampling capacitors Csp and Csm at the time of sampling, Vs1p and Vs1m indicate voltages at the second terminals of the sampling capacitors Csp and Csm at the time of sampling, and Vs2p and Vs2m indicate voltages of the first terminals of the sampling capacitors Csp and Csm at the time of charge transfer, and Vx indicates a voltage of the second terminals of the sampling capacitors Csp and Csm at the time of charge transfer.

Cf indicates a parallel combined capacitance of the integration capacitors Cf1p and Cf2p and a parallel combined capacitance of the integration capacitors Cf1m and Cf2m, Vf1p and Vf2p indicate voltages at the first terminal and the second terminal of the integration capacitors Cf1p and Cf2p at the time of sampling, and Vf1m and Vf2m indicate voltages at the first terminal and the second terminal of the integration capacitors Cf1m and Cf2m at that time of sampling. Further, Voutm indicates a voltage at the non-inverting output terminal of the OP amplifier 29 at the time of charge transfer, Voutp indicates a voltage at the inverting output terminal of the OP amplifier 29 at the time of charge transfer, and Vcm indicates a voltage of AGND1. In this case, the CMFB is adjusted so that the output common voltage of the OP amplifier 29 becomes AGND1.

$$Cs(Vinp-Vsip)+Cf(Vf2p-Vf1p)=Cs(Vs2p-Vx)+Cf(Voutm-Vx) \quad (21)$$

$$Cs(Vinm-Vsim)+Cf(Vf2m-Vf1m)=Cs(Vs2m-Vx)+Cf(Voutp-Vx) \quad (22)$$

$$(Voutp+Voutm)/2=Vcm \quad (23)$$

Solving the above equations (21) to (23) for Vx, the following equation (24) is derived.

$$\begin{aligned} VX &= Cf\{Vcm - Cs(Vinp + Vinm)/2Cf - \\ &\quad (Vf2p + Vf2m - Vf1P - Vf1m)/2 + \\ &\quad Cs(Vs1p + Vs1m + Vs2p + Vs2m\}/(Cs + Cf) \\ &= CfxVcm/(Cs + Cf) - Cs\{(Vinp + Vinm)/2\}(Cs + Cf) + \\ &\quad Cs\{(Vs1p + Vs1m)/2 + (Vs2p + Vs2m)/2\}(Cs + Cf) - \\ &\quad Cf\{(Vf2p + Vf2m)/2 - (Vf1p + Vf1m)/2\}/(Cs + Cf) \end{aligned} \quad (24)$$

In order for the voltage Vx in the above equation (24) to coincide with the output common voltage Vcm, that is, to establish Vx=Vcm, the following operations (a) and (b) are required.

(a) Prior to sampling, the integration capacitors are reset by connecting both terminals of the integration capacitors (Cf1p, Cf1m, Cf2p, Cf2m) to the AGND1.

(b) The second terminals of the sampling capacitors (Csp, Csm) are connected to the AGND1 during sampling, and the first terminals of the sampling capacitors are connected to the AGND2 during charge transfer.

In place of the above operation (b), the following operation (c) may be used performed.

(c) The second terminals of the sampling capacitors are connected to the AGND2 during sampling, and the first terminals of the sampling capacitors are connected to the AGND1 during charge transfer.

However, when sampling the input signals Vinp and Vinm having a relatively high voltage, that is, in case of high voltage sampling, a switch which is to be connected to the AGND2, is required to have a high withstand voltage. Therefore, it is preferred to adopt the operation (b).

As described above, the ADC 21 of the present embodiment has the differential configuration of the ADC 1 of the first embodiment. Therefore, the present embodiment can provide the same operations and effects as the first embodiment. In the configuration of the present embodiment, as described above, the input common voltage of the OP amplifier 29 is constant regardless of the voltage levels of the input signals Vinp and Vinm and does not fluctuate. Therefore, according to the present embodiment, it is possible to input the input signals Vinp and Vinm having a relatively high voltage. Further, according to the present embodiment, the ADC 21 may be configured with low-voltage circuit elements, and as a result, the signal processing operation speed can be increased.

Third Embodiment

A third embodiment will be described below with reference to FIG. 4.

Figure 4:
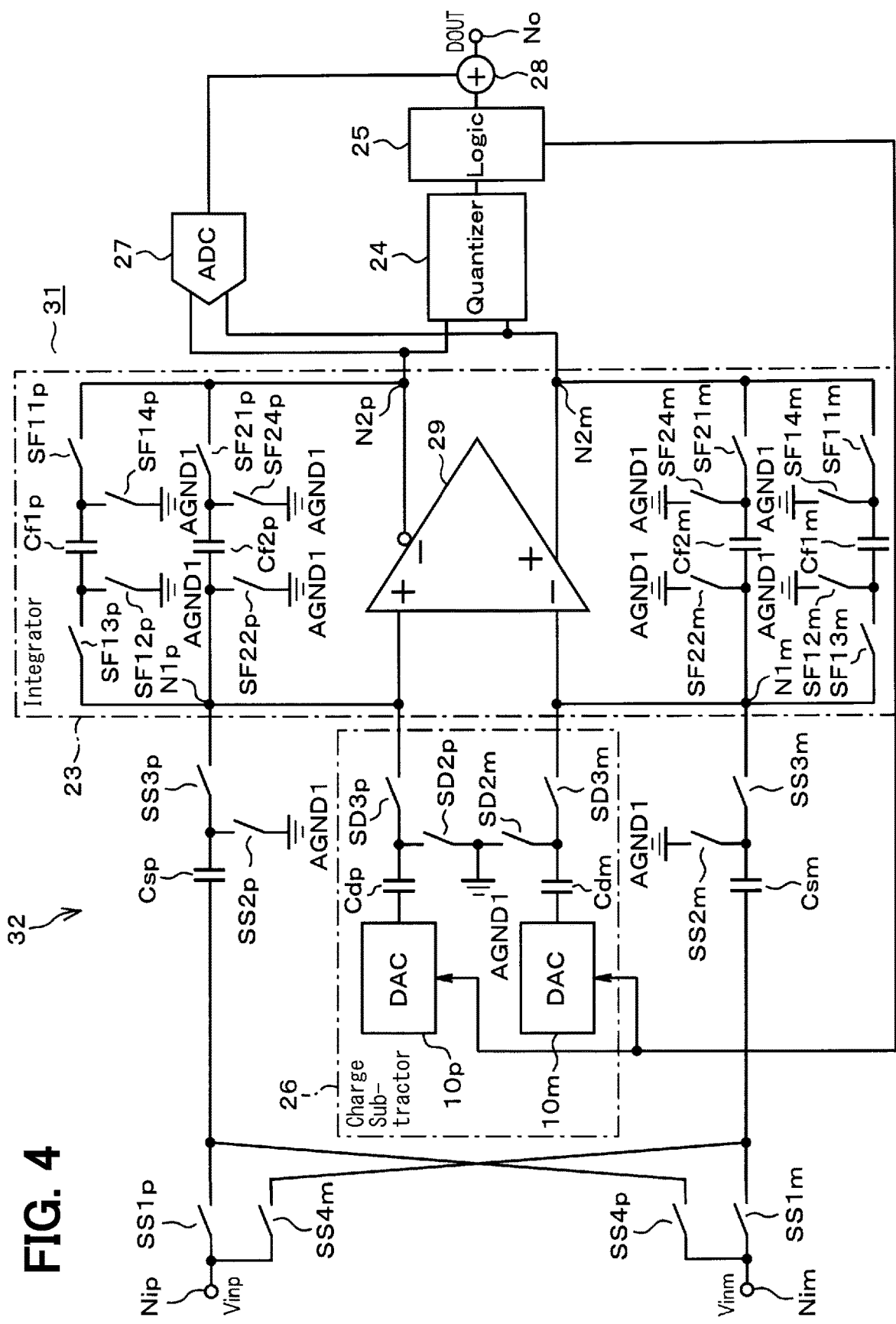
FIG. 4 is a circuit diagram schematically showing a configuration of an A/D converter according to a third embodiment.

As shown in FIG. 4, an ADC 31 of the present embodiment is different from the ADC 21 of the second embodiment in that a sampler 32 is provided instead of the sampler 22. The sampler 32 is different from the sampler 22 in the arrangement of switches SS4p and SS4m.

In this case, the first terminal of the sampling capacitor Csp is connected to the input node Nip through the switch SS1p and to the input node Nim through the switch SS4p. Further, the first terminal of the sampling capacitor Csm is connected to the input node Nim through the switch SS1m and to the input node Nip through the switch SS4m.

In the sampler 32 configured as described above, when the switches SS1p and SS2p are turned on and the switches SS3p and SS4p are turned off, the first terminal of the sampling capacitor Csp is connected to the input node Nip and the second terminal of the sampling capacitor Csp is connected to the AGND1. As a result, the sampler 32 performs a sampling operation for sampling the input signal Vinp. It is noted that the sampling operation for the input signal Vinm is similar to the sampling operation for the input signal Vinp, and a description thereof will be omitted.

Further, when the switches SS1p and SS2p are turned off and the switches SS3p and SS4p are turned on, the first terminal of the sampling capacitor Csp is connected to the input node Nim and the second terminal of the sampling capacitor Csp is connected to the node N1p of the integrator 23. As a result, in the sampler 32, a charge transfer operation is performed in which the charge is transferred from the sampling capacitor Csp to the integration capacitors Cf1p and Cf2p of the integrator 23.

Further, when the switches SS1m and SS2m are turned off and the switches SS3m and SS4m are turned on, the first terminal of the sampling capacitor Csm is connected to the input node Nip and the second terminal of the sampling capacitor Csm is connected to the node N1m of the integrator 23. As a result, in the sampler 32, a charge transfer operation is performed in which the charge is transferred from the sampling capacitor Csm to the integration capacitors Cf1m and Cf2m of the integrator 23.

Thus, in the above configuration, when charge is transferred to the integration capacitor from the sampling capacitor in which one of the input signals Vinp and Vinm is sampled, the first terminal of the sampling capacitor is connected to the input node of the other of the input signals Vinp and Vinm in place of AGND1. That is, in the above configuration, the input is switched between the differentials at the time of charge transfer.

According to the above configuration, the input common voltage of the OP amplifier 29 does not vary for the following reason. First, the following equations (31), (32), (33) and (34) are derived from the law of charge conservation and the like. In the following equations, Cs indicates capacitances of the sampling capacitors Csp and Csm, Vinp and Vinm indicate the voltages of the input signals Vinp and Vinm, and Vx indicates the voltage of the second terminals of the sampling capacitors Csp and Csm during charge transfer.

Further, Cf indicates the parallel combined capacitance of the integration capacitors Cf1p and Cf2p and the parallel combined capacitance of the integration capacitors Cf1m and Cf2m, Voutm indicates the voltage of the non-inverting output terminal of the OP amplifier 29 at the time of charge transfer, Voutp indicates the voltage of the inverting output terminal of the OP amplifier 29 at the time of charge transfer. Vcm indicates the voltage at AGND1, Voutcm indicates the output common voltage of the OP amplifier 29. In this case, the CMFB is adjusted so that the output common voltage of the OP amplifier 29 becomes AGND1.

$$(Vinp-Vcm)Cs=(Vinm-Vx)Cs+(Voutp-Vx)Cf \quad (31)$$

$$Voutp=Cs(Vinp-Vinm-Vcm+Vx)/Cf+Vx \quad (32)$$

$$Voutm=Cs(Vinm-Vinp-Vcm+Vx)/Cf+Vx \quad (33)$$

$$Voutcm=(Voutp+Voutm)/2=Cs(Vx-Vcm)/Cf+Vx \quad (34)$$

Due to the function of CMFB, the output common voltage Voutcm matches the voltage Vcm of AGND1, that is, Voutcm=Vcm holds. Then, the following equations (35) and (36) are derived from the above equation (34).

$$(1+Cs/Cf)Vx=(1+Cs/Cf)Vcm \quad (35)$$

$$Vx=Vcm \quad (36)$$

As shown in the above equation (36), the input common voltage of the OP amplifier 29 is constant at the voltage Vcm regardless of the voltage levels of the input signals Vinp and Vinm.

As described above, the ADC 31 of the present embodiment has the differential configuration of the ADC 1 of the first embodiment. Therefore, the present embodiment can provide the same operations and effects as the first embodiment. In the configuration of the present embodiment, as described above, the input common voltage of the OP amplifier 29 is constant regardless of the voltage levels of the input signals Vinp and Vinm and does not fluctuate. Therefore, according to the present embodiment, it is possible to input the input signals Vinp and Vinm having a relatively high voltage.

Further, according to the present embodiment, the ADC 31 can be configured with low-voltage circuit elements, and as a result, the operation speed can be increased. Furthermore, in the present embodiment, unlike the ADC 21 of the second embodiment, it is not necessary to connect the sampling capacitors Csp and Csm to the common voltage of the input signals Vinp and Vinm. Therefore, in the present embodiment, it is not necessary to provide a configuration such as a power source for separately generating such a common voltage, and accordingly, the circuit size can be reduced as compared with the second embodiment.

Fourth Embodiment

A fourth embodiment will be described below with reference to FIG. 5.

Figure 5:
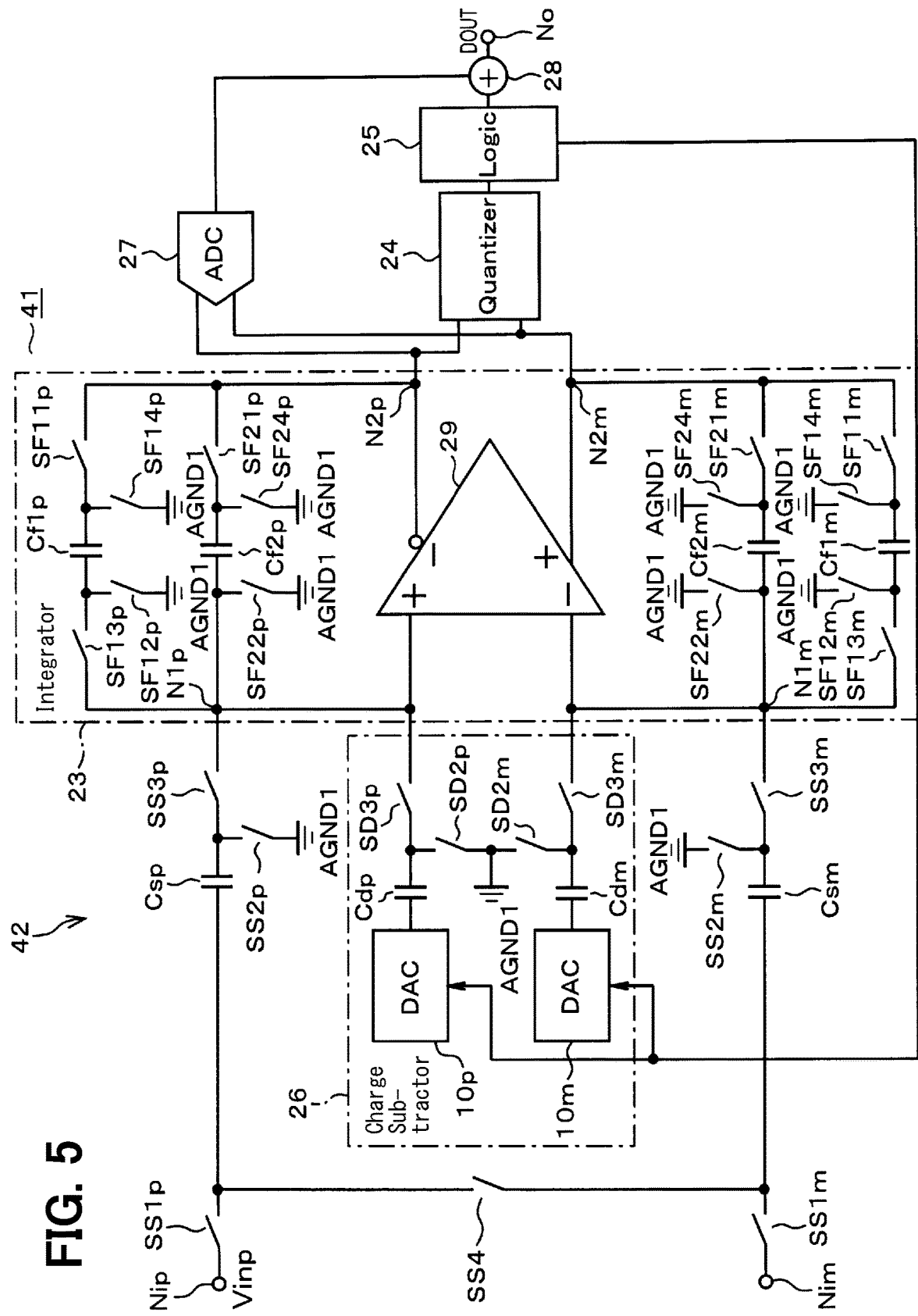
FIG. 5 is a circuit diagram schematically showing a configuration of an A/D converter according to a fourth embodiment.

As shown in FIG. 5, an ADC 41 of this embodiment is different from the ADC 21 of the second embodiment in that a sampler 42 is provided instead of the sampler 22. The sampler 42 is different from the sampler 22 in that a switch SS4 is provided in place of the switches SS4p and SS4m.

In this case, the first terminal of the sampling capacitor Csp is connected to the input node Nip through the switch SS1p and to the first terminal of the sampling capacitor Csm through the switch SS4. Further, the first terminal of the sampling capacitor Csm is connected to the input node Nim through the switch SS1m and to the first terminal of the sampling capacitor Csp through the switch SS4.

In the sampler 42 configured as described above, when the switches SS1p and SS2p are turned on and the switches SS3p and SS4 are turned off, the first terminal of the sampling capacitor Csp is connected to the input node Nip and the second terminal of the sampling capacitor Csp is connected to the AGND1. As a result, the sampler 42 performs a sampling operation for sampling the input signal Vinp. It is noted that the sampling operation for the input signal Vinm is similar to the sampling operation for the input signal Vinp, and a description thereof will be omitted.

Further, when the switches SS1p and SS2p are turned off and the switches SS3p and SS4 are turned on, the first terminal of the sampling capacitor Csp is connected to the first terminal of the sampling capacitor Csm and the second terminal of the sampling capacitor Csp is connected to the node N1p of the integrator 23. As a result, in the sampler 42, a charge transfer operation is performed in which the charge is transferred from the sampling capacitor Csp to the integration capacitors Cf1p and Cf2p of the integrator 23.

Further, when the switches SS1m and SS2m are turned off and the switches SS3m and SS4 are turned on, the first terminal of the sampling capacitor Csm is connected to the first terminal of the sampling capacitor Csp and the second terminal of the sampling capacitor Csm is connected to the node N1m of integrator 23. Thereby, in the sampler 42, a charge transfer operation is performed in which the charge is transferred from the sampling capacitor Csm to the integration capacitors Cf1m and Cf2m of the integrator 23.

Thus, in the above configuration, when the charge is transferred from the sampling capacitor, in which one of the input signals Vinp and Vinm is sampled, to the integration capacitor, the first terminal of the sampling capacitor is not connected to the AGND1 and is connected to the first terminal of the sampling capacitor, in which the other of the input signals Vinp and Vinm is sampled. That is, in the above configuration, the input is short-circuited between the differentials during the charge transfer.

According to the above configuration, the input common voltage of the OP amplifier 29 does not vary for the following reason. First, the following equations (41), (42), (43) and (44) are derived from the law of charge conservation. In the following equations, Cs indicates the capacitance of the sampling capacitors Csp and Csm, Vinp and Vinm indicate the voltages of the input signals Vinp and Vinm, Vi indicate the voltage of the sampling capacitors Csp and Csm at the time of charge transfer, and Vx indicates the voltage of each second terminal of the sampling capacitors Csp and Csm at the time of charge transfer.

Further, Cf indicates the parallel combined capacitance of the integration capacitors Cf1p and Cf2p and the parallel combined capacitance of the integration capacitors Cf1m and Cf2m, Voutm indicates the voltage at the non-inverting output terminal of the OP amplifier 29 at the time of charge transfer, Voutp indicates the voltage of the inverting output terminal of the OP amplifier 29 at the time of charge transfer, Vcm indicates the voltage of AGND1, Vincm indicates the input common voltage of the OP amplifier 29, and Voutcm indicates the output common voltage of the OP amplifier 29.

In this case, the CMFB is adjusted so that the output common voltage of the OP amplifier 29 becomes AGND1.

$$(Vinp-Vcm)Cs=(Vi-Vx)Cs+(Voutp-Vx)Cf \quad (41)$$

$$Voutp=Cs(Vinp-Vi-Vcm+Vx)/Cf+Vx \quad (42)$$

$$Voutm=Cs(Vinm-Vi-Vcm+Vx)/Cf+Vx \quad (43)$$

$$Voutcm=(Voutp+Voutm)/2=Cs(Vincm-Vi+Vx-Vcm)/Cf+Vx \quad (44)$$

Due to the function of CMFB, the output common voltage Voutcm coincides with the voltage Vcm of AGND1, that is, Voutcm=Vcm holds. Then, the following equation (45) is derived from the above equation (44).

$$(1+Cs/Cf)Vx=(1+Cs/Cf)Vcm-Cs(Vinm-Vi)/Cf \quad (45)$$

Since the ADC 41 has a differential configuration, the following equation (46) and hence the following equation (47) are established assuming that impedances at both ends of the sampling capacitors Csp and Csm are substantially matched in a differential manner.

$$Vincm \approx Vi \quad (46)$$

$$Vx \approx Vcm \quad (47)$$

As shown in the above equation (47), the input common voltage of the OP amplifier 29 is constant at the voltage Vcm regardless of the voltage levels of the input signals Vinp and Vinm.

As described above, the ADC 41 according to the present embodiment has the differential configuration of the ADC 1 of the first embodiment. Therefore, the present embodiment provides the similar operations and effects as those of the first embodiment. In the configuration of the present embodiment, as described above, the input common voltage of the OP amplifier 29 is constant regardless of the voltage levels of the input signals Vinp and Vinm and does not fluctuate. Therefore, according to the present embodiment, it is possible to input the input signals Vinp and Vinm having a relatively high voltage.

Further, according to the present embodiment, each circuit element constituting the ADC 41 can be configured with low voltage elements, and as a result, the operation speed can be increased. Furthermore, in the present embodiment, unlike the ADC 21 of the second embodiment, it is not necessary to connect the sampling capacitors Csp and Csm to the common voltage of the input signals Vinp and Vinm. Therefore, in the present embodiment, it is not necessary to provide a configuration such as a power source for separately generating such a common voltage, and accordingly, the circuit size can be reduced as compared with the second embodiment.

Fifth Embodiment

A fifth embodiment will be described below with reference to FIG. 6 to FIG. 12.

As described in the above embodiments, a general ADC having a sample-and-hold configuration at its input stage is adopted as the sub-ADC. In the present embodiment, four specific configuration examples of the sub-ADC that can be applied to the configuration of the first embodiment will be described.

[1] First Configuration Example

Figure 6:
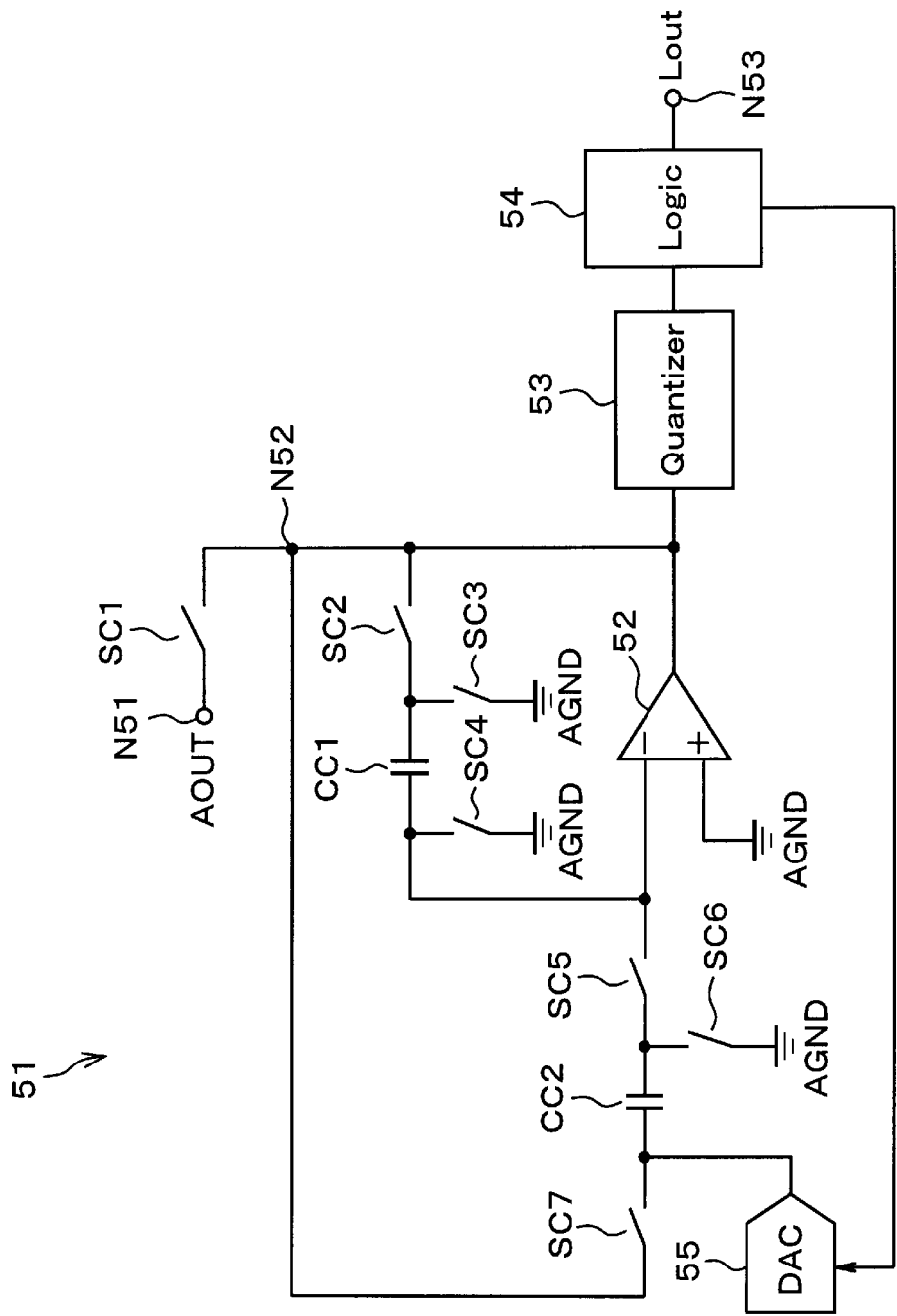
FIG. 6 is a circuit diagram schematically showing a first configuration example of a sub-A/D converter according to a fifth embodiment.

A sub-ADC 51 of a first configuration example shown in FIG. 6 is configured as a general cyclic type ADC, which includes switches SC1 to SC7, capacitors CC1, CC2, an OP amplifier 52, a quantizer 53, a logic circuit 54, a DAC 55 and the like. The switch SC1 is connected between an input node N51, to which the output signal AOUT of the OP amplifier 9 is input, and a node N52. The node N2 is connected to the output terminal of the OP amplifier 9. A first terminal of the capacitor CC1 is connected to an inverting input terminal of the OP amplifier 52, and is connected to the AGND through the switch SC4.

A second terminal of the capacitor CC1 is connected to the node N52 through the switch SC2 and is connected to the AGND through the switch SC3. A non-inverting input terminal of the OP amplifier 52 is connected to the AGND. A first terminal of the capacitor CC2 is connected to the node N52 through the switch SC7. A second terminal of the capacitor CC2 is connected to an inverting input terminal of the OP amplifier 52 through the switch SC5, and is connected to the AGND through the switch SC6.

An output signal of the OP amplifier 52 is input to the quantizer 53. The quantizer 53 quantizes the output signal of the OP amplifier 52 and outputs a quantization result that is a result of the quantization. An output of the quantizer 53 is input to the logic circuit 54. The logic circuit 54 outputs the quantization result of the quantizer 53 to the DAC 55. Further, the logic circuit 54 generates a digital value Lout corresponding to least significant bits of the output signal DOUT based on the quantization result by the quantizer 53 and outputs the digital value Lout through the node N53. The DAC 55 outputs a DAC voltage determined based on the quantization result provided from the logic circuit 54. An output terminal of the DAC 55 is connected to the first terminal of the capacitor CC2.

Figure 7:
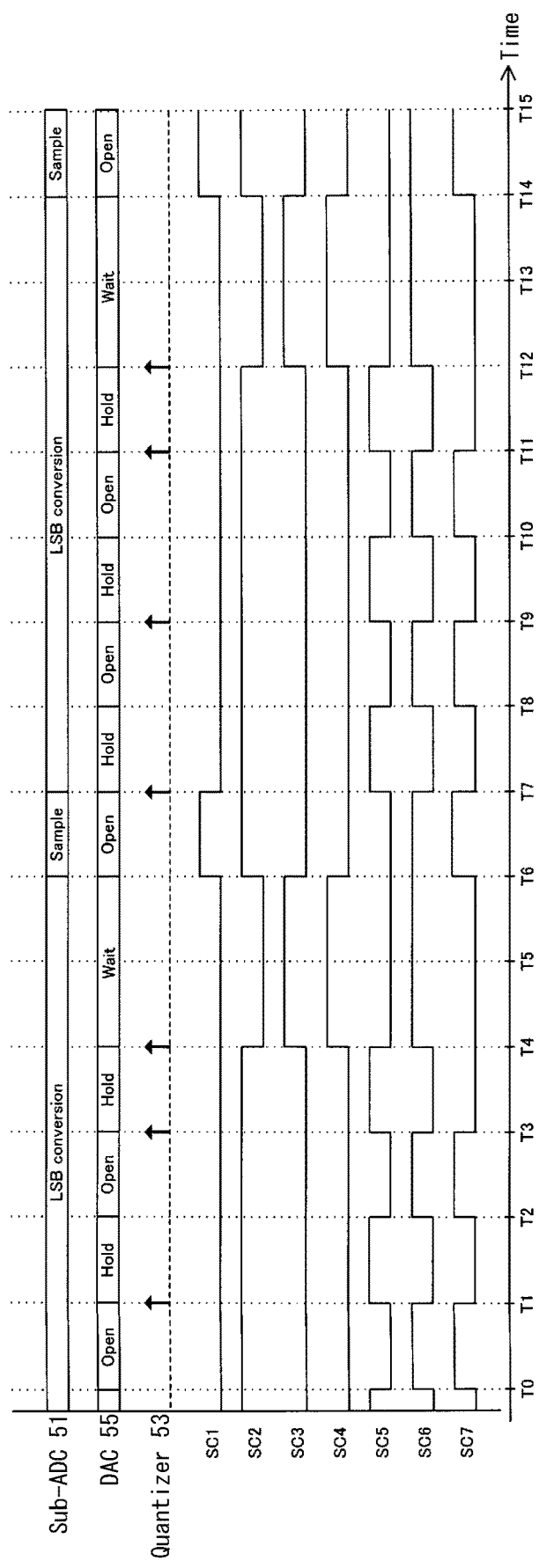
FIG. 7 is a timing chart schematically showing an operation state of each circuit unit in the sub-A/D converter of the first configuration example.

The operation of the sub-ADC 51 configured as described above is, for example, shown in the timing chart of FIG. 7. Although a detailed description of the operation is omitted, the sub-ADC 51 is configured to perform the same operation as a general cyclic type ADC. The cyclic type ADC has advantages such as a high operating speed and a small size. Therefore, if the sub-ADC 51 having such a configuration is adopted as the sub-ADC 7 of the first embodiment, the processing speed can be increased and the circuit size can be reduced.

[2] Second Configuration Example

Figure 8:
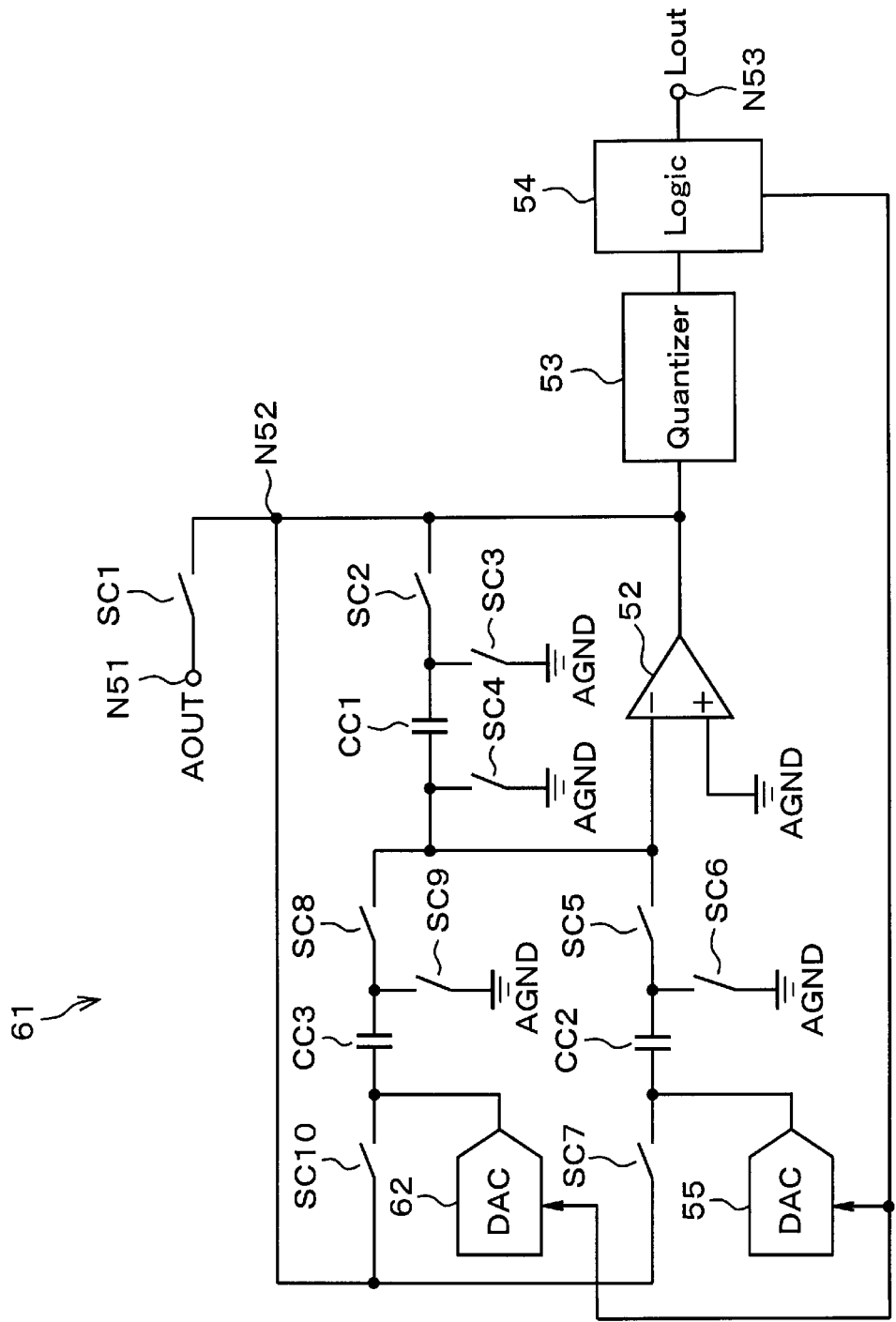
FIG. 8 is a circuit diagram schematically showing a second configuration example of a sub-A/D converter according to a fifth embodiment.

A sub-ADC 61 of a second configuration example shown in FIG. 8 is configured as a general double-speed cyclic type ADC. That is, the sub-ADC 61 is configured as a double-speed cyclic type ADC which executes A/D conversion twice in each cycle of an operation clock. In the sub-ADC 61, switches SC8 to SC10, capacitors CC3 and DAC 62 are added to the sub-ADC 51 of the first configuration example.

A first terminal of the capacitor CC3 is connected to the node N52 through the switch SC10. A second terminal of the capacitor CC3 is connected to an inverting input terminal of the OP amplifier 52 through the switch SC8, and is connected to the AGND through the switch SC9. In this case, the quantization result of the quantizer 53 output from the logic circuit 54 is also provided to the DAC 62. The DAC 62 outputs a DAC voltage determined based on the quantization result provided from the logic circuit 54. An output terminal of the DAC 62 is connected to the first terminal of the capacitor CC3.

Figure 9:
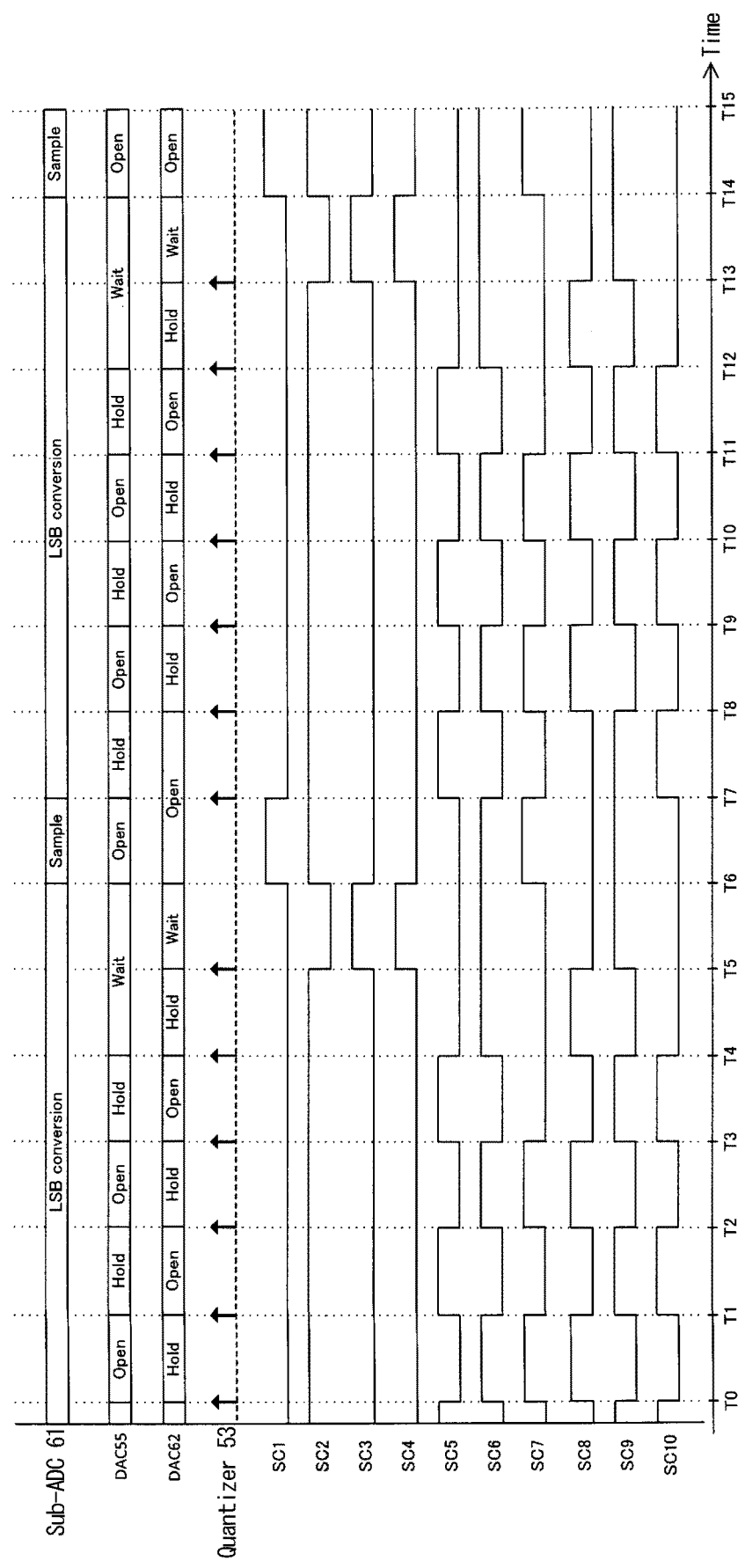
FIG. 9 is a timing chart schematically showing an operation state of each circuit unit in the sub-A/D converter of the second configuration example.

An operation of the sub-ADC 61 configured as described above is, for example, shown in the timing chart of FIG. 9. Although a detailed description of the operation is omitted, the sub-ADC 61 is configured to perform the same operation as a general double-speed cyclic type ADC. Since the double-speed cyclic type ADC performs conversion twice in one clock cycle by two DACs, it is of advantage that the operation speed is higher than that of a single-speed cyclic type ADC. Therefore, if the sub-ADC 61 having such a configuration is adopted as the sub-ADC 7 of the first embodiment, the signal processing speed can be further increased as compared with the case where the sub-ADC 51 of the first configuration example is adopted.

[3] Third Configuration Example

Figure 10:
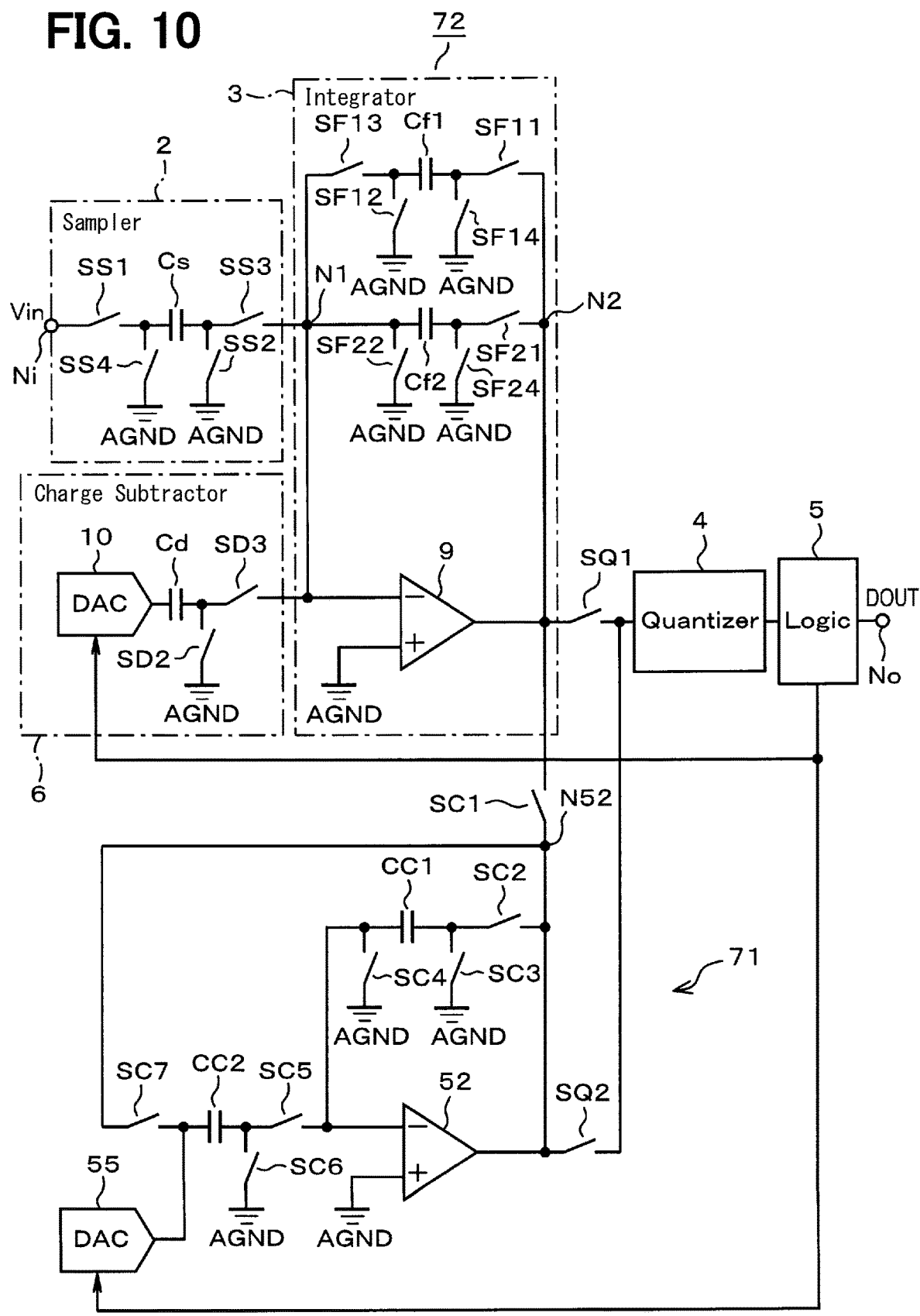
FIG. 10 is a circuit diagram schematically showing a configuration of an A/D converter to which a sub-A/D converter of a third configuration example according to the fifth embodiment is applied.

A sub-ADC 71 of a third configuration example shown in FIG. 10 is also configured as a general cyclic type ADC, similarly to the sub-ADC 51 of the first configuration example. However, the sub-ADC 71 is different from the sub-ADC 51 of the first configuration example in that a switch SQ2 is added and the quantizer 53 and the logic circuit 54 are omitted. FIG. 10 shows an overall configuration when such an sub-ADC 71 is applied to an ADC 72 similar to the ADC 1 of the first embodiment.

Although the ADC 72 is different from the ADC 1 in that the switch SQ1 is added and the adder 8 is omitted, the basic configuration is the same as that of the ADC 1. In this case, the quantizer 4 and the logic circuit 5 included in the ADC 72 are used by both the ADC 72 and the sub-ADC 71, that is, are shared by the ADC 72 and the sub-ADC 71. That is, the sub-ADC 71 is configured to perform quantization using the quantizer 4 included in the ADC 72.

Specifically, the output signal of the OP amplifier 9 of the integrator 3 is input to the quantizer 4 through the switch SQ1, and the output signal of the OP amplifier 52 of the sub-ADC 71 is input through the switch SQ2. The switch SQ1 is turned on during a period in which quantization in the ADC 72, that is, the main ADC, is performed, and is turned off in other periods. Further, the switch SQ2 is turned on during a period in which the quantization in the sub-ADC 71 is performed, and is turned off in other periods.

In this case, the logic circuit 5 generates a digital value corresponding to the most significant bits of the output signal DOUT based on the quantization result output from the quantizer 4 and also a digital value corresponding to the least significant bits of the output signal DOUT. Then, the logic circuit 5 outputs the output signal DOUT generated by adding the generated digital values through the node No.

Figure 11:
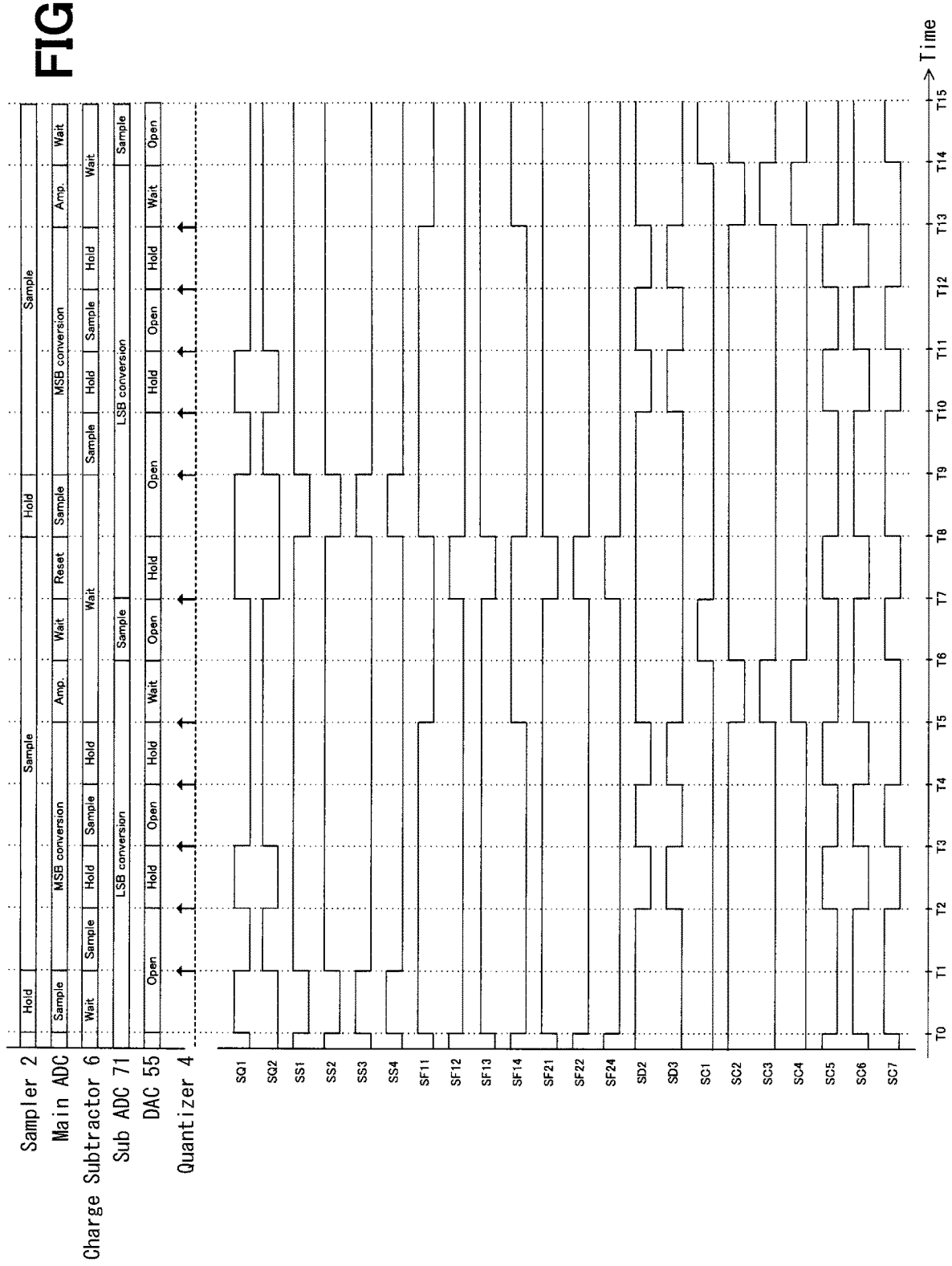
FIG. 11 is a timing chart schematically showing an operation state of each circuit unit in an A/D converter to which the sub-A/D converter of the third configuration example is applied.

An operation of the ADC 72 configured as described above is, for example, shown in the timing chart of FIG. 11. In this case, the ADC 72 performs the similar operation as the ADC 1 of the first embodiment, and the sub-ADC 71 performs the similar operation as the sub-ADC 51 of the first configuration example. However, the sub-ADC 71 performs its A/D conversion operation in parallel with the operation of the ADC 72, that is, the main ADC. Therefore, the quantizer 4 performs the quantization not only at times T1, T3, T9 and T11 but also at times T2, T4, T5, T7, T10, T12 and T13.

According to such a configuration, as in the case where the sub-ADC 51 of the first configuration example is adopted as the sub-ADC 7 of the first embodiment, the processing operation can be speeded up and the circuit size can be sized down. Further, in this case, the sub-ADC 71 is configured to share the quantizer 4 included in the ADC 72, and the circuit size can be reduced correspondingly. Therefore, according to the above configuration, the ADC 72 can be further downsized as a whole.

In the above configuration, in case that a threshold voltage used for quantization in the ADC 72 and a threshold voltage used for quantization in the sub-ADC 71 are the same, the quantizer 4 may be configured to use a fixed threshold voltage. On the other hand, in case that the threshold voltage used for quantization in the ADC 72 and the threshold voltage used for quantization in the sub-ADC 71 are different, the quantizer 4 may be configured to be able to switch the threshold voltage.

[4] Fourth Configuration Example

Figure 12:
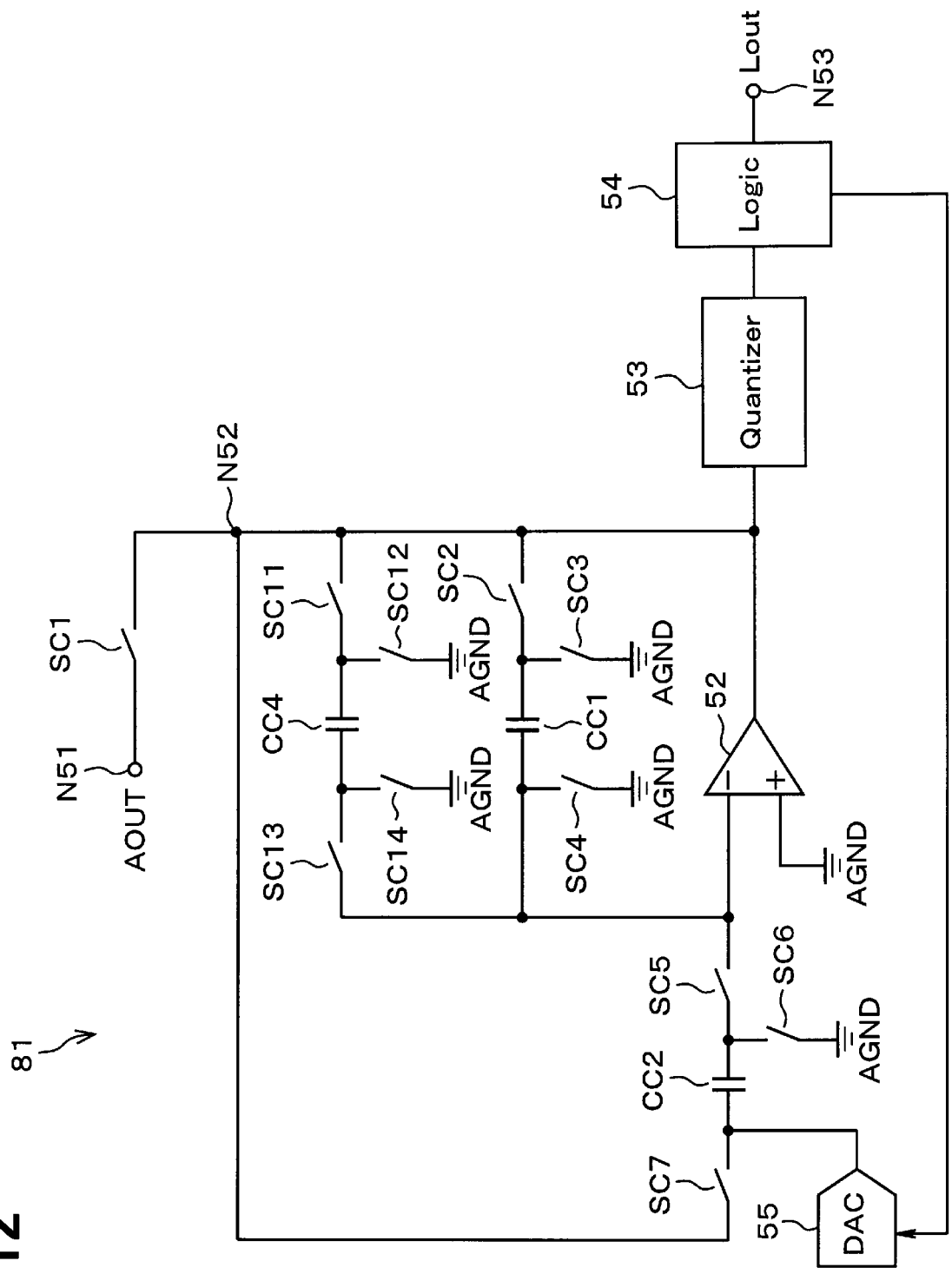
FIG. 12 is a circuit diagram schematically showing a fourth configuration example of the sub-A/D converter according to the fifth embodiment.

A sub-ADC 81 according to a fourth configuration example shown in FIG. 12 is configured as a general cyclic type ADC. However, the sub-ADC 81 has an amplifying function for amplifying a voltage corresponding to the charge remaining in the integration capacitor. That is, the sub-ADC 81 is different from the sub-ADC 51 of the first configuration example in that a capacitor CC4 and switches SC11 to SC14 are added.

A first terminal of the capacitor CC4 is connected to an inverting input terminal of an OP amplifier 52 through the switch SC13, and is connected to the AGND through the switch SC14. A second terminal of the capacitor CC4 is connected to a node N52 through the switch SC11 and is connected to the AGND through the switch SC12. That is, the connection form of the OP amplifier 52, the capacitors CC1 and CC4, and the switches SC2 to SC4 and SC11 to SC14 of the sub-ADC 81 is similar to the connection form of the OP amplifier 9, the integration capacitors Cf1 and Cf2, the switches SF11 to SF14, SF21, SF22 and SF24 of the integrator 3. In such a configuration, the amplification function is realized by switching each switch in the same manner as the amplification operation in the main ADC described in the first embodiment.

In case the sub-ADC 81 having the above configuration is adopted as the sub-ADC 7 of the first embodiment, the processing speed can be increased and circuit size can be reduced as in the case where the sub-ADC 51 of the first configuration example is adopted as the sub-ADC 7 of the first embodiment. Further, in this case, the sub-ADC 81 is configured to have an amplification function for amplifying a voltage corresponding to the charge remaining in the integration capacitor. Therefore, according to the above configuration, the amplifying operation in the main ADC which is performed in the periods from time T5 to time T7, from time T13 to time T15 and the like.

In case the amplification operation in the main ADC is not performed, it is possible to extend the period of the A/D conversion operation of the main ADC by the period required for such an amplification operation and increase the resolution, or to shorten the entire operation period by the amount of time required for such an amplification operation. Further, in this case, it is possible to eliminate the configuration for realizing the amplification operation in the ADC 1, and reduce the circuit size by the amount of such an eliminated configuration.

Other Embodiment

The present disclosure is not limited to each embodiment described above and shown in the drawings and may be arbitrarily modified, combined or expanded.

The numerical values and the like referred to in the above embodiments are examples and are not limited thereto.

In the first embodiment, in order to simplify the description, the ADC 1 having a single-ended circuit configuration is described as an example as illustrated in FIG. 1. However, the configuration unique to the present disclosure described in the first embodiment may also be applied to ADCs having a differential circuit configuration.

Although the present disclosure is described based on the embodiments, it is to be understood that the present disclosure should not be limited to the examples and structures described above. The present disclosure includes various modifications and variations within the equivalent range. In addition, various combinations and forms, as well as other combinations and forms including only one element, more or less, are within the scope and spirit of the present disclosure.

What is claimed is:
1. An A/D converter for converting an analog signal applied as an input signal to a digital value, the A/D converter comprising:
    a sampling capacitor for sampling the analog signal;
    an integrator including an operational amplifier and an integration capacitor provide between a first input terminal and an output terminal of the operational amplifier;
    a quantizer for outputting a quantization result provided by quantizing an output signal of the operational amplifier;
    a charge subtraction unit including a D/A converter that determines a DAC voltage for subtracting a charge of the integration capacitor based on the quantization result, and a DAC capacitor that stores a charge corresponding to the DAC voltage; and
    a sub-A/D converter connected to the output terminal of the OP amplifier in parallel to the quantizer and having a sample-and-hold configuration at an input stage thereof,
wherein
the analog signal is sampled, when a first terminal of the sampling capacitor is connected to an input node of the analog signal and a second terminal of the sampling capacitor is connected to an analog ground in the A/D converter;
a charge transfer operation is performed for transferring the charge from the sampling capacitor to the integration capacitor, when the first terminal of the sampling capacitor is connected to the analog ground and the second terminal of the sampling capacitor is connected to the first input terminal of the operational amplifier;
a quantization is performed by inputting the output signal of the operational amplifier to the quantizer;
most significant bits of the digital value are generated by repeating the subtraction operation, in which the charge subtraction unit subtracts the charge accumulated in the integration capacitor based on the quantization result, a predetermined number of times;
least significant bits of the digital value is generated when a voltage provided by amplifying a voltage corresponding to the charge remaining in the integration capacitor is input to the sub-A/D converter after generation of the most significant bits;
a sum of the most significant bits and the least significant bits are output as the digital value,
initialization of the charge of the integration capacitor, and the charge transfer operation and generation of the most significant bits for a next A/D conversion are performed in parallel with the A/D conversion in the sub-A/D converter after the generation of the most significant bits.

2. The A/D converter according to claim 1, wherein:
the amplifier has a differential input configuration for converting a difference between two analog signals, which are complementary to each other; and
when the charge is transferred from the sampling capacitor to the integration capacitor, the first terminal of the sampling capacitor is connected to a common voltage of the two analog signals in place of connection to the analog ground.

3. The A/D converter according to claim 1, wherein:
the amplifier has a differential input configuration for converting a difference between two analog signals, which are complementary to each other; and
when the charge is transferred from one of the sampling capacitors, by which one of the analog signals is sampled, to the integration capacitor, a first terminal of the one of the sampling capacitors is connected to an input node of an other of the analog signals in place of the connection to the analog ground.

4. The A/D converter according to claim 1, wherein:
the amplifier has a differential input configuration for converting a difference between two analog signals, which are complementary to each other; and
when the charge is transferred from one of the sampling capacitors, by which one of the analog signals is sampled, to the integration capacitor, a first terminal of the one of the sampling capacitors is connected to the first terminal of an other of the sampling capacitors, by which an other of the analog signals is sampled, in place of the connection to the analog ground.

5. The A/D converter according to claim 1, wherein:
the sub-A/D converter is configured as a cyclic type A/D converter.

6. The A/D converter according to claim 1, wherein:
the A/D converter is configured as a double-speed cyclic type A/D converter, which performs the A/D conversion twice in each cycle of an operation clock.

7. The A/D converter according to claim 5, wherein:
the sub-A/D converter is configured to perform the quantization by using the quantizer.

8. The A/D converter according to claim 5, wherein:
the sub-A/D converter has an amplification function for amplifying a voltage corresponding to a charge remaining in the integration capacitor.

* * * * *